United States Patent [19]
Kwon

[11] Patent Number: 5,912,185
[45] Date of Patent: Jun. 15, 1999

[54] METHODS FOR FORMING CONTACT HOLES HAVING IMPROVED SIDEWALL PROFILES

[75] Inventor: Hyuk-kyung Kwon, Seoul, Rep. of Korea

[73] Assignee: Samsung Electronics Co., Ltd., Rep. of Korea

[21] Appl. No.: 08/772,431

[22] Filed: Dec. 24, 1996

[30] Foreign Application Priority Data

Dec. 30, 1995 [KR] Rep. of Korea .................. 95-69722

[51] Int. Cl.⁶ .................................................. H01L 21/302
[52] U.S. Cl. .......................... 438/698; 438/701; 438/704; 438/723; 438/734; 438/749; 438/756
[58] Field of Search .................................. 216/57; 438/697, 438/698, 700, 704, 706, 723, 743, 756, 701, 734, 749

[56] References Cited

U.S. PATENT DOCUMENTS

| | | | |
|---|---|---|---|
| 4,176,003 | 11/1979 | Brower et al. ........................ | 430/313 |
| 4,455,568 | 6/1984 | Shiota ................................... | 357/54 |
| 5,219,791 | 6/1993 | Frieberger ............................. | 437/195 |
| 5,223,450 | 6/1993 | Fujino et al. ........................... | 437/62 |
| 5,266,525 | 11/1993 | Morozumi .............................. | 437/195 |
| 5,320,932 | 6/1994 | Haraguchi et al. .................... | 430/312 |
| 5,405,489 | 4/1995 | Kim et al. .............................. | 156/643 |
| 5,413,953 | 5/1995 | Chien et al. ............................ | 437/69 |
| 5,654,213 | 8/1997 | Choi et al. .............................. | 438/227 |
| 5,672,907 | 9/1997 | Kasagi ................................... | 257/632 |

FOREIGN PATENT DOCUMENTS

| | | |
|---|---|---|
| 280633 | 7/1990 | German Dem. Rep. . |
| 3-136317 | 6/1991 | Japan . |
| 6-097159 | 4/1994 | Japan . |
| 6-188242 | 7/1994 | Japan . |

*Primary Examiner*—Benjamin Utech
*Assistant Examiner*—George Goudreau
*Attorney, Agent, or Firm*—Myers Bigel Sibley & Sajovec

[57] ABSTRACT

A method for forming a contact hole in a phosphosilicate glass layer includes the steps of forming a phosphosilicate glass layer, reflowing the phosphosilicate glass layer, removing a surface portion of the phosphosilicate glass layer, and forming the contact hole in the phosphosilicate glass layer. In particular, the surface portion of the phosphosilicate glass layer can be on the order of about 1000 Å thick, and the step of removing the surface portion can include etching the surface portion. Furthermore, the step of forming the contact hole can include the step of selectively wet etching the phosphosilicate glass layer followed by the step of selectively dry etching the phosphosilicate glass layer.

11 Claims, 3 Drawing Sheets

METHODS FOR FORMING CONTACT HOLES HAVING IMPROVED SIDEWALL PROFILES

FIELD OF THE INVENTION

The present invention relates to the field of microelectronics and more particularly to contact holes for microelectronic structures.

BACKGROUND OF THE INVENTION

When manufacturing microelectronic devices, a phosphosilicate glass (PSG) layer is commonly deposited prior to forming metal wiring thereon. More particularly, the phosphosilicate glass layer can be used to reduce the steepness of steps on the device thereby enhancing the step coverage of the metal wiring. When used to reduce the steepness of steps, the phosphosilicate glass layer is typically reflowed prior to depositing the metal.

If the phosphosilicate glass layer is formed at a low temperature, however, a porous open structure of Si—O—Si having a large bond-angle and large pores may be formed. Accordingly, the step of reflowing the phosphosilicate glass may cause $P_2O_5$ to dissipate from the PSG layer because of the high vapor pressure of $P_2O_5$. A surface portion of the PSG layer may thus have a lower concentration of phosphorous than a lower portion of the PSG layer causing the surface portion to have a lower etching rate than the lower portion.

As shown in FIGS. 1A and 1B, a contact hole formed in the reflowed PSG layer using a wet etch may include a negative slope (or lip) at the surface portion of the PSG layer. This negative slope (or lip) may cause difficulties during later processing steps.

SUMMARY OF THE INVENTION

It is therefor an object of the present invention to provide improved methods for forming contact holes in phosphosilicate glass layers.

It is another object of the present invention to provide methods for forming contact holes having improved sidewall profiles.

These and other objects are provided according to the present invention by methods including the steps of forming a layer of an insulating material, removing a surface portion of the layer of the insulating material, and forming a contact hole in the layer of the insulating material. Accordingly, nonuniformities occurring at the surface of the insulating layer can be removed thus improving the profile of the contact hole formed therein. In particular, the insulating material can be phosphosilicate glass which may have a lower concentration of phosphorous at the surface so that the removing step removes the surface portion of the phosphosilicate glass layer having the lower concentration of phosphorous.

The step of removing the surface portion is preferably preceded by the step of reflowing the phosphosilicate glass layer. The reflow step can reduce the steepness of steps in the phosphosilicate glass layer, but the reflow step may also reduce the concentration of phosphorous at the surface of the phosphosilicate glass layer thereby reducing the uniformity of an etch rate through the layer. Accordingly, the following step of removing the surface portion of the phosphosilicate glass layer can remove the portion of the layer having the lower phosphorous concentration thereby leaving a phosphosilicate glass layer with a relatively uniform concentration of phosphorous and as a result a relatively uniform etch rate. In particular, the step of removing the surface portion can include removing a surface portion having a thickness of about 1000 Å.

An etch can thus be used to form the contact hole so that the profile of the contact hole is improved. Because the phosphosilicate glass layer has a relatively uniform etch rate the formation of a negative slope (or lip) can be reduced. More particularly, the step of forming the contact hole can include the step of selectively wet etching the layer of the insulating material followed by the step of selectively dry etching the layer of the insulating material.

The methods of the present invention can thus be used to provide improved contact holes through phosphosilicate glass layers. In particular, these methods allow the formation of contact holes with sidewalls with reduced lips at the surface thereof.

DETAILED DESCRIPTION OF THE INVENTION

Figures 1A, 1B:
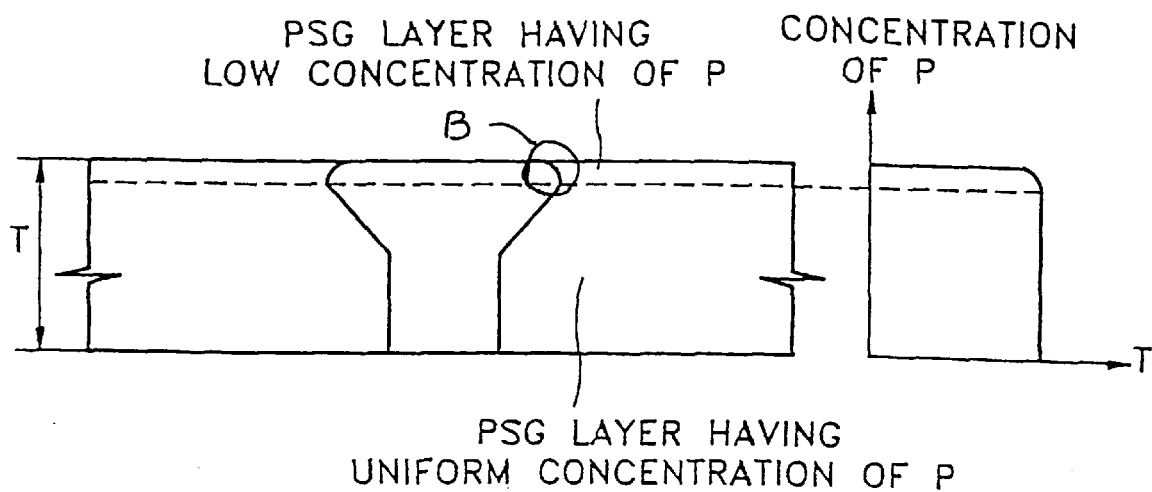
FIGS. 1A and 1B are cross sectional views of a contact hole formed in a phosphosilicate glass layer according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figures 2A, 2B:
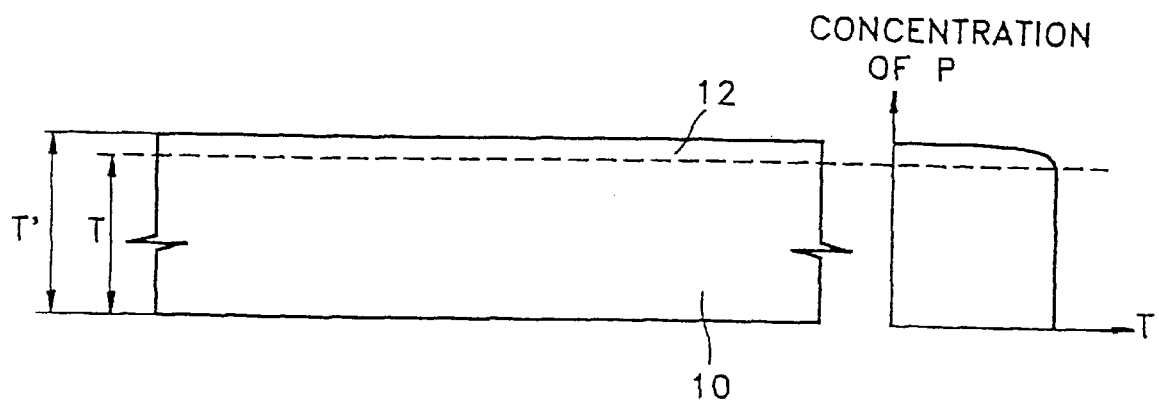
FIGS. 2A through 2E are cross sectional views and concentration profiles illustrating steps of a method for forming a contact hole according to the present invention.

A method for forming a contact hole in a phosphosilicate glass (PSG) layer according to the present invention will now be discussed with reference to FIGS. 2A–2E. As shown in FIGS. 2A and 2B, a layer of phosphosilicate glass 10 is deposited to a thickness T' which is greater than a depth T desired for the contact hole. Preferably, the thickness T' of the PSG layer 10 is on the order of about 1,000 Å thicker than the depth T' desired for the contact hole.

The PSG layer 10 is then reflowed thereby reducing the steepness of any steps. As discussed above, however, the reflow step may cause $P_2O_5$ to dissipate from a surface portion 12 of the PSG layer 10 so that the surface portion 12 has a lower concentration of phosphorous. The surface portion 12 may thus have a lower etch rate than the other portions of the PSG layer 10.

Figures 2C, 2D:
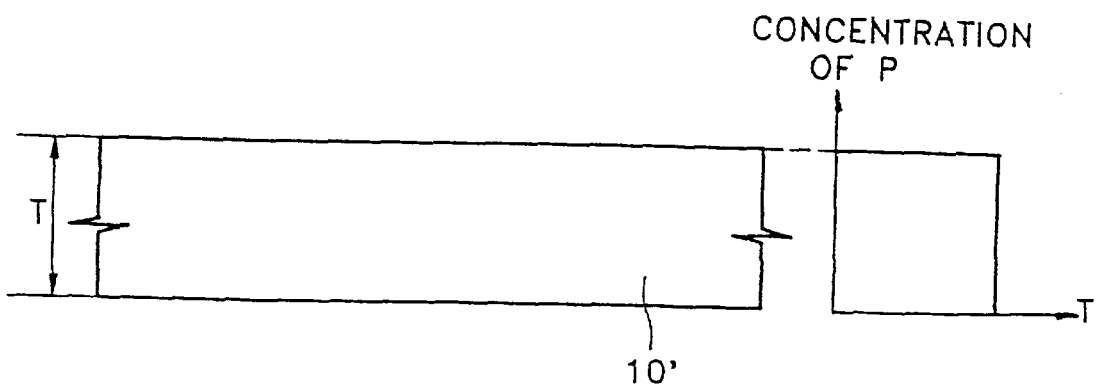

As shown in FIGS. 2C and 2D, the surface portion 12 of the PSG layer 10 can be removed so that the remaining PSG layer 10' has a relatively uniform concentration of phosphorous and thus a relatively uniform etch rate. In particular, the PSG layer can be treated with a BHF (buffered HF) solution, such as a solution of DI and HF having a ratio of 10:1, to remove the surface portion 12 having the lower concentration of phosphorous. Alternately, a dry etch can be used to remove the surface portion. Accordingly, the concentration of phosphorous throughout the remaining PSG layer 10' is relatively uniform.

Figure 2E:
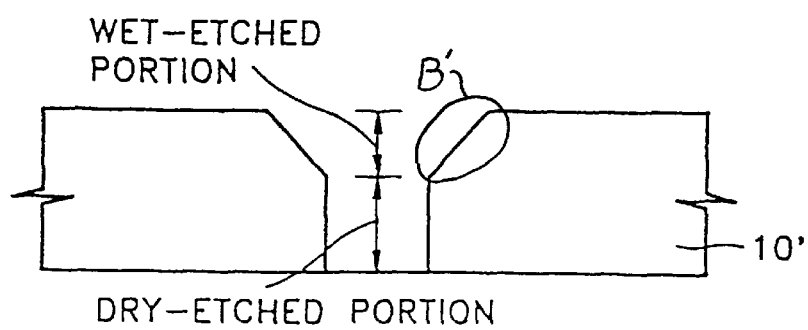

A contact hole can then be formed in the PSG layer 10' as shown in FIG. 2E. The PSG layer 10' can be initially etched using a wet etch to form an aperture for the contact hole. Thereafter, a body portion of the contact hole can be formed using a dry etch.

Because the concentration of phosphorous in the PSG layer 10' is relatively uniform from top to bottom, the etch rate using the wet etchant will be relatively uniform. Accordingly, formation of the negatively sloping sidewall (or sidewall lip) can be reduced. The profile to the contact hole can thus be improved.

As shown in FIG. 1A, the contact hole formed according to the prior art includes a sidewall with a surface portion having a negative slope B (or lip). As shown in FIG. 2E, the contact hole formed according to the present invention includes a side wall with a surface portion having a positive slope B' (without a lip).

The profile of a contact hole in a PSG layer can thus be improved by providing a PSG layer which has a relatively uniform concentration of phosphorous after reflow. In particular, a negative slope (or lip) of the sidewall can be reduced.

Figure 3:
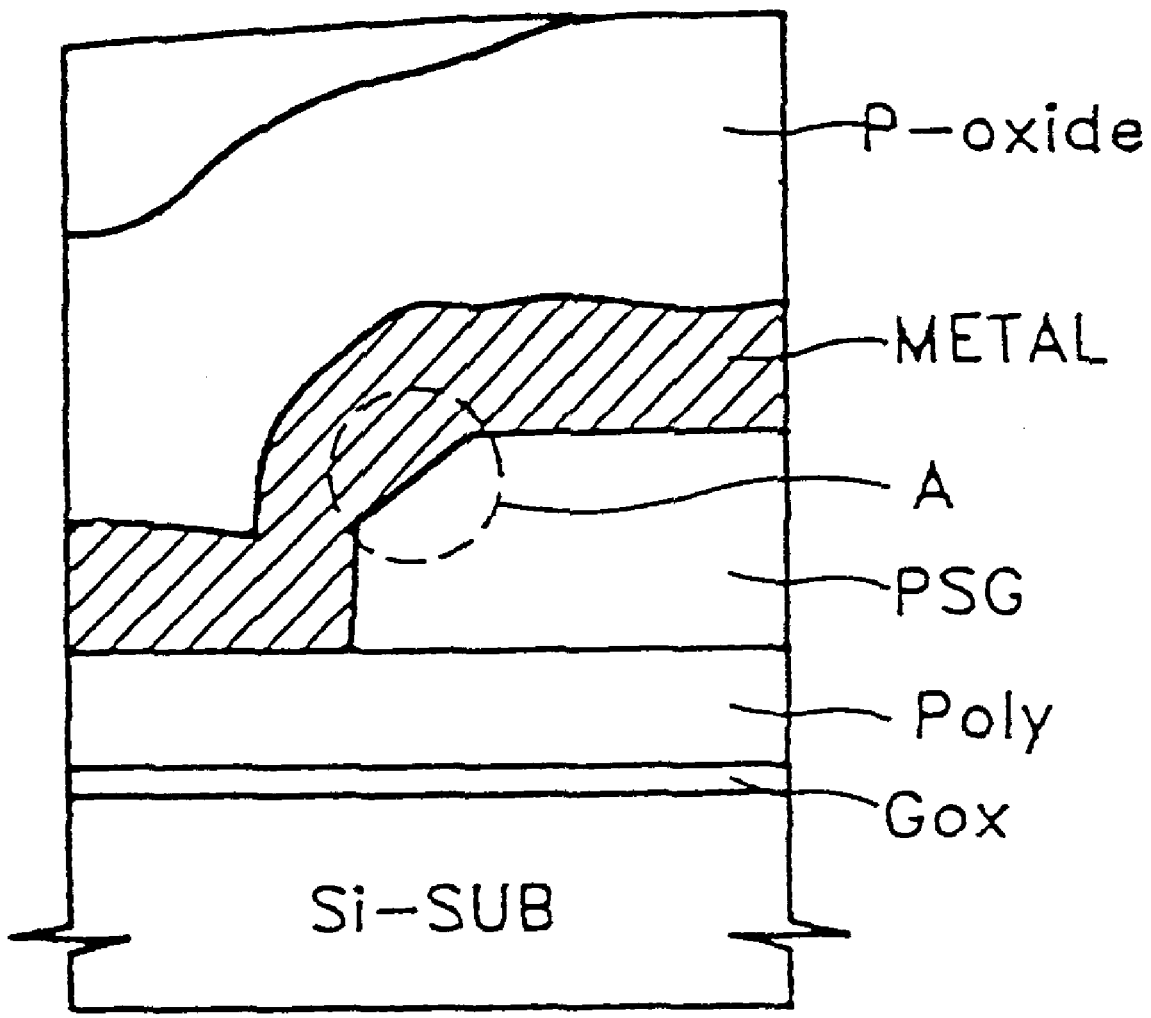
FIG. 3 is a cross sectional view illustrating a microelectronic structure including a phosphosilicate glass layer formed by a method according to the present invention.

FIG. 3 illustrates a microelectronic structure including a phosphosilicate glass layer PSG according to the present invention. As shown, the microelectronic structure includes a silicon substrate Si-SUB, a gate oxide layer Gox, a polysilicon layer Poly, a phosphosilicate glass layer PSG, a metal layer METAL, and a passivation layer P-oxide. Using the methods discussed above, a portion of the polysilicon layer Poly can be exposed by the phosphosilicate glass layer PSG thus providing a contact between the metal layer METAL and the polysilicon layer Poly. In particular, the methods of the present invention provide that the sidewall of the phosphosilicate glass layer PSG has a sidewall A with a positive slope (without a lip).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for forming a contact hole in a phosphosilicate glass (PSG) layer, said method comprising the steps of:
    forming a phosphosilicate glass (PSG) layer;
    reflowing said phosphosilicate glass (PSG) layer;
    removing a surface portion of said phosphosilicate glass (PSG) layer without forming a contact hole in said phosphosilicate glass layer; and
    forming said contact hole in said phosphosilicate glass (PSG) layer.

2. A method according to claim 1 wherein said surface portion of said phosphosilicate glass (PSG) layer is on the order of about 1000 Å thick.

3. A method according to claim 1 wherein said step of removing said surface portion comprises etching said surface portion.

4. A method according to claim 1 wherein said step of forming said contact hole comprises the step of selectively wet etching said phosphosilicate glass (PSG) layer followed by the step of selectively dry etching said phosphosilicate glass (PSG) layer.

5. A method for forming a contact hole in an insulating layer, said method comprising the steps of:
    forming a layer of an insulating material wherein said insulating material comprises a doped glass;
    reflowing said doped glass;
    removing a surface portion of said layer of said insulating material without forming a contact hole in said layer of said insulating material wherein said step of removing said surface portion is preceded by the step of reflowing said doped glass; and
    forming a contact hole in said layer of said insulating material.

6. A method according to claim 5 wherein said insulating material comprises phosphosilicate glass (PSG).

7. A method according to claim 6 wherein said surface portion of said phosphosilicate glass (PSG) layer is on the order of about 1000 Å thick.

8. A method according to claim 5 wherein said step of removing said surface portion comprises etching said surface portion.

9. A method according to claim 5 wherein said step of forming said contact hole comprises the step of selectively wet etching said layer of said insulating material followed by the step of selectively dry etching said layer of said insulating material.

10. A method for forming a contact hole having an improved profile in a phosphosilicate glass (PSG) layer, said method comprising the steps of:
    depositing a phosphosilicate glass (PSG) layer having a first thickness greater than a desired depth for the contact hole to be formed in said phosphosilicate glass (PSG) layer;
    reflowing said phosphosilicate glass (PSG) layer;
    etching back said reflowed phosphosilicate glass (PSG) layer, so that said phosphosilicate glass (PSG) layer has a second thickness approximately equal to the desired depth for the contact hole to be formed in said phosphosilicate glass (PSG) layer without forming a contact hole in said psg layer; and
    forming the contact hole in the etched phosphosilicate glass (PSG) layer.

11. A method according to claim 1 wherein the first thickness of said phosphosilicate glass (PSG) layer is approximately 1000 Å thicker than the desired depth for the contact hole.

* * * * *